(12) United States Patent
Jung

(10) Patent No.: US 10,014,358 B2
(45) Date of Patent: Jul. 3, 2018

(54) ORGANIC LIGHT EMITTING DISPLAY HAVING A FIRST INSULATING LAYER AND A GATE METAL LAYER CONSTITUTE A FIRST CAPACITOR

(71) Applicant: LG Display Co., Ltd., Seoul (KR)

(72) Inventor: Kiyoung Jung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/868,858

(22) Filed: Jan. 11, 2018

(65) Prior Publication Data

US 2018/0138253 A1 May 17, 2018

Related U.S. Application Data

(63) Continuation of application No. 15/377,094, filed on Dec. 13, 2016, now Pat. No. 9,876,065.

(30) Foreign Application Priority Data

Dec. 30, 2015 (KR) .......................... 10-2015-0190228

(51) Int. Cl.
 *H01L 27/32* (2006.01)
(52) U.S. Cl.
 CPC ...... *H01L 27/3258* (2013.01); *H01L 27/3248* (2013.01); *H01L 27/3262* (2013.01)
(58) Field of Classification Search
 CPC . H01L 27/32; H01L 27/3246; H01L 27/3248; H01L 27/3258; H01L 2227/32; H01L 2924/12044
 See application file for complete search history.

(56) References Cited

U.S. PATENT DOCUMENTS

| 2003/0151358 A1 | 8/2003 | Iga |
| 2005/0057460 A1 | 3/2005 | Lee et al. |

(Continued)

FOREIGN PATENT DOCUMENTS

| EP | 1804229 A1 | 7/2007 |
| TW | 201021207 A | 6/2010 |

(Continued)

OTHER PUBLICATIONS

Office Action dated Jun. 28, 2017, for corresponding Taiwanese Patent Application No. 105143205.

(Continued)

*Primary Examiner* — Hoai V Pham
(74) *Attorney, Agent, or Firm* — Morgan, Lewis & Bockius LLP

(57) ABSTRACT

Organic light-emitting display is disclosed. The organic light-emitting display includes a first substrate, a semiconductor layer positioned on the first substrate, a first insulating layer positioned on the semiconductor layer, a gate metal layer positioned on the first insulating layer, a second insulating layer with a contact hole exposing part of the gate metal layer, a source-drain metal layer positioned on the second insulating layer and electrically connected to the gate metal layer via the contact hole, a third insulating layer positioned on the source-drain metal layer, a fourth insulating layer positioned on the third insulating layer, and a pixel electrode positioned on the fourth insulating layer, wherein the fourth insulating layer fully covers the contact hole, and a stepped portion of the pixel electrode caused by the fourth insulating layer is spaced apart from the contact hole.

1 Claim, 12 Drawing Sheets

(56) References Cited

U.S. PATENT DOCUMENTS

| | | |
|---|---|---|
| 2007/0052352 A1 | 3/2007 | Im et al. |
| 2010/0032667 A1 | 2/2010 | Yamazaki et al. |
| 2013/0257839 A1 | 10/2013 | Hyeon et al. |
| 2014/0353616 A1 | 12/2014 | Park et al. |
| 2014/0353622 A1 | 12/2014 | You et al. |
| 2016/0351643 A1* | 12/2016 | Xie ......................... H01L 21/77 |
| 2017/0162822 A1 | 6/2017 | Park |
| 2017/0179205 A1 | 6/2017 | Kim |

FOREIGN PATENT DOCUMENTS

| | | |
|---|---|---|
| TW | 201503329 A | 1/2015 |
| TW | 201507136 A | 2/2015 |
| WO | 2004/090853 A1 | 10/2004 |

OTHER PUBLICATIONS

Office Action dated May 26, 2017, issued in corresponding United Kingdom Patent Application No. GB1622138.4.

\* cited by examiner

ORGANIC LIGHT EMITTING DISPLAY HAVING A FIRST INSULATING LAYER AND A GATE METAL LAYER CONSTITUTE A FIRST CAPACITOR This is a continuation application of copending U.S. application Ser. No. 15/377,094, filed on Dec. 13, 2016, which claims the priority benefit of Korean Patent Application No. 10-2015-0190228 filed on Dec. 30, 2015, both of which are hereby incorporated herein by reference for all purposes as if fully set forth herein.

BACKGROUND

Field of the Invention

The present disclosure relates to an organic light emitting display.

Discussion of the Related Art

Recently, various flat panel displays that are less bulky and lighter than cathode ray tubes (CRTs) are being developed. Examples of the flat panel displays include liquid crystal displays (LCDs), field emission displays (FEDs), plasma display panels (PDPs), organic light-emitting displays (OLEDs), etc. Among these types of flat panel displays, the organic light-emitting displays are self-luminous displays that emit light through excitation of organic compounds. The organic light emitting diode displays work without a backlight used in LCDs; thus, they can be lighter and thinner and made in a simplified process. Also, the organic light emitting diode displays can be manufactured at low temperatures, have a fast response time of 1 ms or less, and feature low power consumption, wide viewing angle, and high contrast.

An organic light-emitting display comprises an emissive layer of organic materials between a first electrode as an anode and a second electrode as a cathode. As such, a hole from the first electrode and an electron from the second electrode recombine within the emissive layer, forming an exciton, i.e., a hole-electron pair. Then, energy is created as the exciton returns to the ground state, thereby causing the organic light-emitting display to emit light. Organic light-emitting displays may be classified as bottom-emission devices and top-emission devices depending on the direction light exits the device. In the case of the bottom-emission devices, light exits towards the bottom of the substrate, that is, from the emissive layer to the first electrode. In the case of the top-emission devices, light exits towards the top of the substrate, that is, from the emissive layer to the second electrode.

With increasingly higher resolution displays becoming available, they need smaller pixel sizes. Thus, the design limit requirements for a layout that requires circuit configuration within a limited space are getting tighter. In this case, there may be problems (structural weak spots), including the failure to form capacitors and their disappearance due to a short-circuit between electrodes, which need to be solved.

SUMMARY

Accordingly, the present invention is directed to an organic light emitting display that substantially obviates one or more of the problems due to limitations and disadvantages of the related art An object of the present disclosure is to provide an organic light emitting display that solves the problem of failure to form capacitors and their disappearance due to a short-circuit between electrodes, which happens because the design limit requirements for a layout that requires circuit configuration within a limited space of subpixels are tighter in implementing a display panel with UHD or higher resolution.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light-emitting display comprises a first substrate, a semiconductor layer positioned on the first substrate, a first insulating layer positioned on the semiconductor layer, a gate metal layer positioned on the first insulating layer, a second insulating layer with a contact hole exposing part of the gate metal layer, a source-drain metal layer positioned on the second insulating layer and electrically connected to the gate metal layer via the contact hole, a third insulating layer positioned on the source-drain metal layer, a fourth insulating layer positioned on the third insulating layer, and a pixel electrode positioned on the fourth insulating layer, wherein the fourth insulating layer fully covers the contact hole, and a stepped portion of the pixel electrode caused by the fourth insulating layer is spaced apart from the contact hole.

The fourth insulating layer is a planarization film which is made of an organic material and makes flat irregularities beneath the fourth insulating layer.

The second insulating layer has a first stepped portion on the edge of the gate metal layer, and the fourth insulating layer covers the stepped portion of the second insulating layer.

The source-drain metal layer has a second stepped portion along the first stepped portion of the second insulating layer, and the fourth insulating layer covers the second stepped portion of the source-drain metal layer.

The third insulating layer has a third stepped portion along the second stepped portion of the source-drain metal layer, and the fourth insulating layer covers the third stepped portion of the third insulating layer.

The first stepped portion, the second stepped portion, and the third stepped portion are disposed adjacent to each other.

The gate metal layer in the shape of an island.

The fourth insulating layer is shaped in such a manner as to enclose the surrounding area of the contact hole.

The fourth insulating layer has a shape in which a part protrudes from an area adjacent to the contact hole.

The gate metal layer comprises a horizontal portion and a vertical portion, and the horizontal portion and the vertical portion are connected together.

The horizontal portion is parallel to the side surface of the fourth insulating layer adjacent to the horizontal portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
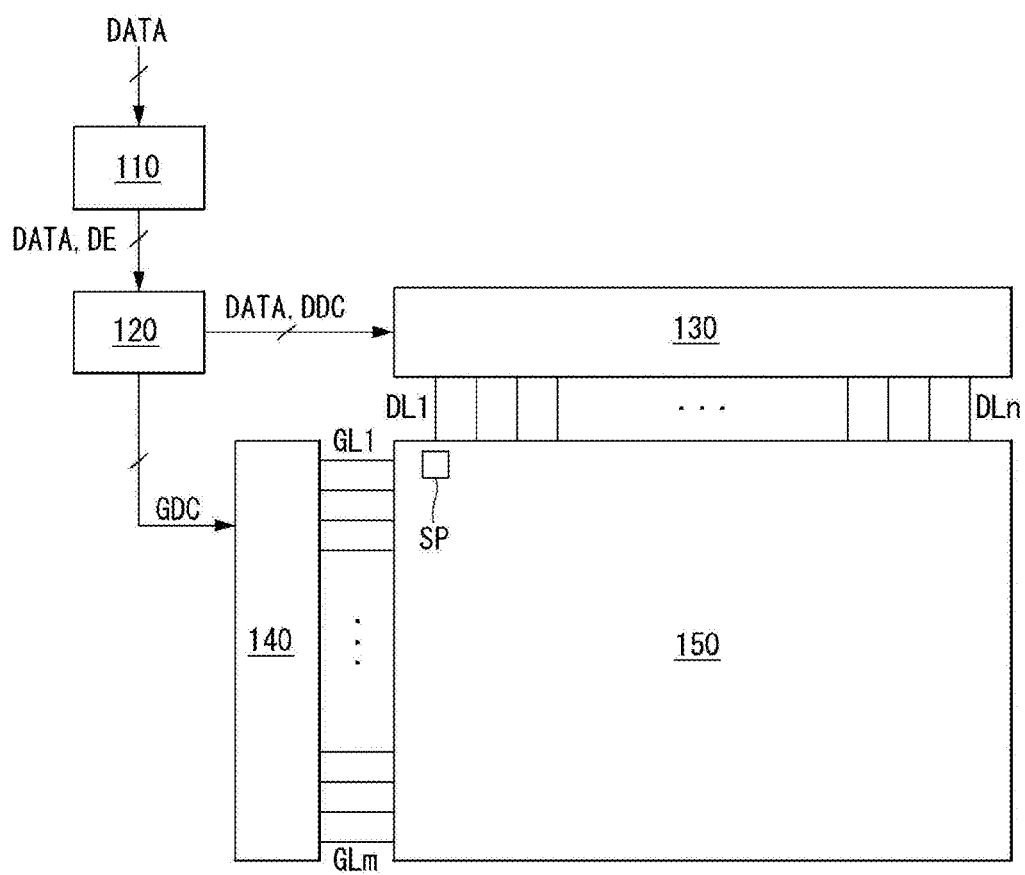
FIG. 1 is a schematic block diagram of an organic light-emitting display according to an exemplary embodiment of the present disclosure.

Hereinafter, exemplary embodiments of the present disclosure will be described in detail with reference to the accompanying drawings. Like reference numerals designate substantially like elements throughout the specification. In the following description, detailed descriptions of well-known functions or configurations associated with the present disclosure will be omitted if they are deemed to unnecessarily obscure the subject matters of the present disclosure. The names of the elements used in the following description may be selected for ease of writing the specification, and may be different from the names of parts in actual products.

While a display device according to the present disclosure may be an organic light-emitting display, a liquid crystal display, an electrophoresis display, etc., the present disclosure will be described with respect to an organic light-emitting display. The organic light-emitting display comprises an emissive layer of organic materials between a first electrode as an anode and a second electrode as a cathode. As such, a hole from the first electrode and an electron from the second electrode recombine within the emissive layer, forming an exciton, i.e., a hole-electron pair. Then, energy is created as the exciton returns to the ground state, thereby causing the self-luminous display to emit light. The organic light-emitting display according to the present disclosure may be a plastic display with display elements that are formed on a flexible plastic substrate, as well as on a glass substrate.

Figure 2:
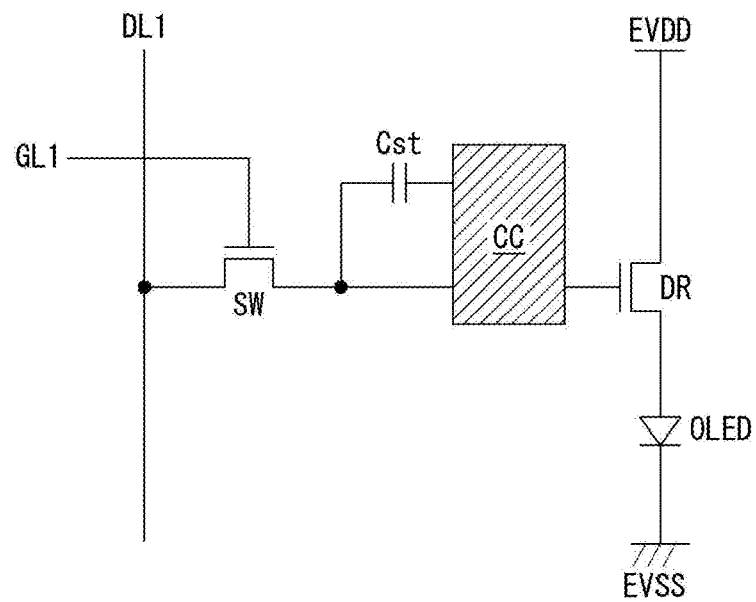
FIG. 2 is a schematic circuit diagram of a subpixel.
Figure 3:
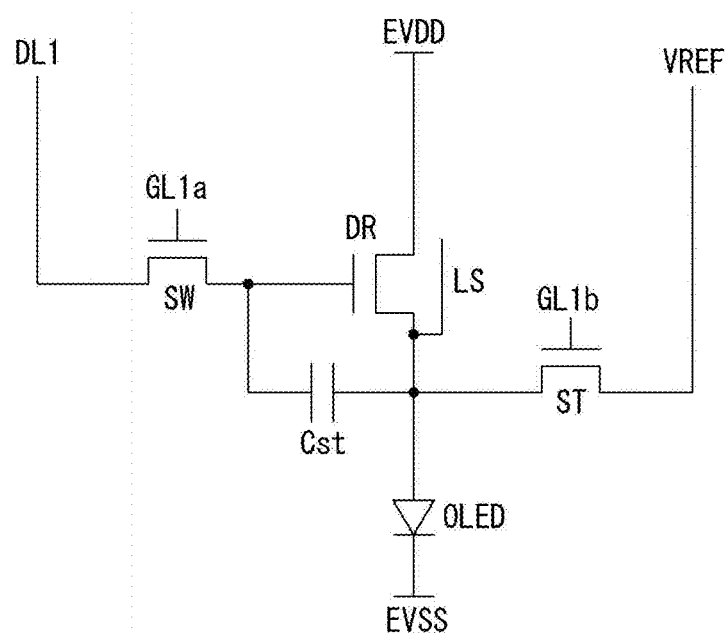
FIG. 3 is a first illustration of the circuit configuration of a subpixel according to an exemplary embodiment of the present disclosure.
Figure 4:
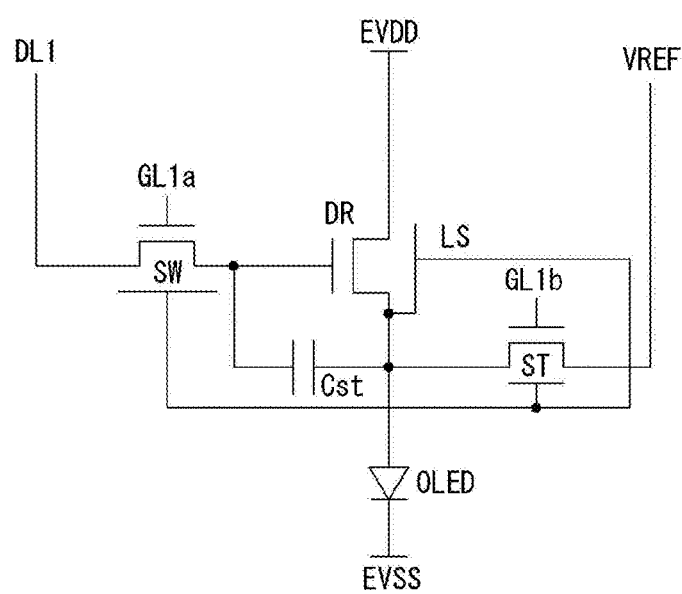
FIG. 4 is a second illustration of the circuit configuration of a subpixel according to an exemplary embodiment of the present disclosure.
Figure 5:
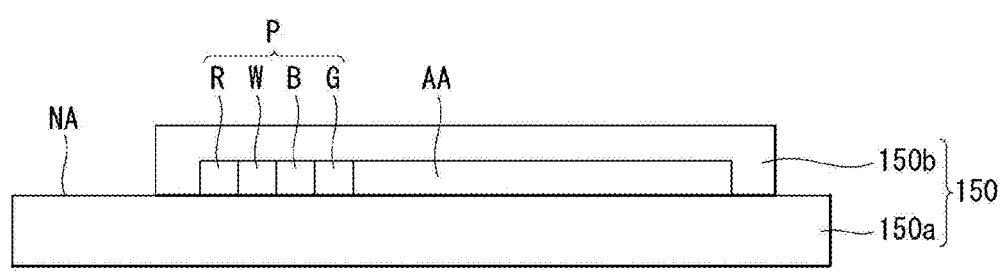
FIG. 5 is an illustration of a cross-section of a display panel according to an exemplary embodiment of the present disclosure.

FIG. 1 is a schematic block diagram of an organic light-emitting display according to an exemplary embodiment of the present disclosure. FIG. 2 is a schematic circuit diagram of a subpixel. FIG. 3 is a first illustration of the circuit configuration of a subpixel according to an exemplary embodiment of the present disclosure. FIG. 4 is a second illustration of the circuit configuration of a subpixel according to an exemplary embodiment of the present disclosure. FIG. 5 is an illustration of a cross-section of a display panel according to an exemplary embodiment of the present disclosure.

As shown in FIG. 1, an organic light-emitting display according to an exemplary embodiment of the present disclosure comprises an image processor 110, a timing controller 120, a data driver 130, a scan driver 140, and a display panel 150.

The image processor 110 outputs a data enable signal DE, etc., along with an externally supplied data signal DATA. The image processor 110 may output one or more among a vertical synchronization signal, horizontal synchronization signal, and clock signal, in addition to the data enable signal DE, but these signals are not shown in the drawings for convenience of explanation.

The timing controller 120 receives the data signal DATA from the image processor 110, along with the data enable signal DE or driving signals including the vertical synchronization signal, horizontal synchronization signal, and clock signal. Based on the driving signals, the timing controller 120 outputs a gate timing control signal GDC for controlling the operation timing of the scan driver 140 and a timing control signal DDC for controlling the operation timing of the data driver 130.

In response to the data timing control signal DDC supplied from the timing controller 120, the data driver 130 samples and latches the data signal DATA supplied form the timing controller 120, converts it to a gamma reference voltage, and outputs the gamma reference voltage. The data driver 130 outputs the data signal through data lines DL1 to DLn. The data driver 130 may come in the form of an IC.

In response to the gate timing control signal GDC supplied from the timing controller 120, the scan driver 140 outputs a scan signal while shifting the level of a gate voltage. The scan driver 140 outputs the scan signal through scan lines GL1 to GLm. The scan driver 140 comes in the form of an IC, or is formed on the display panel 150 by the gate-in-panel technology.

The display panel 150 displays an image, corresponding to the data signal DATA and scan signal respectively supplied from the data driver 130 and scan driver 140. The display panel 150 comprises subpixels SP that operate to display an image.

The subpixels are made to be top-emitting, bottom-emitting, or dual-emitting depending on the structure. The subpixels SP comprise red subpixels, green subpixels, and blue subpixels, or comprise white subpixels, red subpixels, green subpixels, and blue subpixels. The light-emission area of one or more of the subpixels SP is different from that of the others depending on the light-emission characteristics.

As shown in FIG. 2, a subpixel comprises a switching transistor SW, a driving transistor DR, a capacitor Cst, a compensation circuit CC, and an organic light-emitting diode OLED.

In response to a scan signal supplied through the first scan line GL1, the switching transistor SW is switched on so that a data signal supplied through the first data line DL1 is stored as a data voltage in a capacitor Cst. The driving transistor DR operates so that a driving current flows between a first power supply line EVDD and a second power supply line EVSS in response to the data voltage stored in the capacitor Cst. The organic light-emitting diode OLED operates to emit light in response to the drive current formed by the driving transistor DR.

The compensation circuit CC is a circuit added to the subpixel to compensate the threshold voltage, etc. of the driving transistor DR. The compensation circuit CC consists of one or more transistors. The compensation circuit CC has a wide variety of configurations depending on the compensation method, so an example of this will be described below.

As shown in FIGS. 3 and 4, the compensation circuit CC comprises a sensing transistor ST and a sensing line VREF. The sensing transistor ST is connected between a source line of the driving transistor DR and the anode (hereinafter, sensing node) of the organic light-emitting diode OLED. The sensing transistor ST operates to supply a reset voltage (or sensing voltage) passed through the sensing line VREF to the sensing node or to sense the voltage or current at the sensing node.

The switching transistor SW has a first electrode connected to the first data line DL1 and a second electrode connected to a gate electrode of the driving transistor DR. The driving transistor DR has a first electrode connected to the first power supply line EVDD and a second electrode connected to the anode of the organic light-emitting diode OLED. The capacitor Cst has a first electrode connected to the gate electrode of the driving transistor DR and a second electrode connected to the anode of the organic light-emitting diode. The organic light-emitting diode OLED has the anode connected to the second electrode and a cathode connected to the second power supply line EVSS. The sensing transistor ST has a first electrode connected to the sensing line VREF and a second electrode connected to the anode, which is a sensing node, of the organic light-emitting diode OLED.

The operating time of the sensing transistor ST may be similar to or the same as or different from that of the switching transistor SW depending on the compensation algorithm (or the configuration of the compensation circuit). In an example, the switching transistor SW may have a gate electrode connected to a 1a-th scan line GL1a, and the sensing transistor ST may have a gate electrode connected to a 1b-th scan line GL1b. In another example, the 1a-th scan line GL1a connected to the gate electrode of the switching transistor SW and the 1b-th scan line GL1b connected to the gate electrode of the sensing transistor ST may be connected so that they can be commonly shared.

The sensing line VREF may be connected to the data driver. In this case, the data driver may sense the sensing node of the subpixel and perform a compensation according to the sensing result, in real time during a non-display period of an image or an N frame period (N is an integer equal to or greater than 1). Meanwhile, the switching transistor SW and the sensing transistor ST may be turned on at the same time. In this case, a sensing operation through the sensing line VREF and a data output operation for outputting a data signal are distinguished based on the time-division method of the data driver.

Besides, a digital data signal, an analog data signal, or a gamma voltage may be compensated according to a sensing result. Also, a compensation circuit that generates a compensation signal (or compensation voltage) based on the sensing result may be implemented within the data driver, within the timing controller, or as a separate circuit.

FIGS. 3 and 4 illustrate, by way of example, a subpixel with a three-capacitor one-capacitor 3T1C structure which comprises a switching transistor SW, a driving transistor DR, a capacitor Cst, an organic light-emitting diode OLED, and a sensing transistor. Besides, the subpixel may consist of 3T2C, 4T2C, 5T1C, 6T2C, etc., with the addition of a compensation circuit CC.

Meanwhile, the configuration of a light shielding layer is different between the circuit of the subpixel of FIG. 3 and the circuit of the subpixel of FIG. 4. The light shielding layer LS exists to shield outside light. If the light shielding layer LS is made of a metallic material, the problem that the parasitic voltage is charged is induced. For this reason, the light shielding layer LS is connected to the source electrode of the driving transistor DR.

Specifically, the light shielding layer LS may be disposed in the lower part of a channel region of the driving transistor DR, as shown in FIG. 3, or the light shielding layer LS may be disposed in the lower parts of channel regions of the switching transistor SW and sensing transistor ST, as well as in the lower part of the channel region of the driving transistor DR, as shown in FIG. 4.

The light shielding layer LS may be used only for blocking outside light (FIG. 3), or the light shielding layer LS may be used as an electrode that facilitates connections with other electrodes or lines and constitutes a capacitor, etc.

As shown in FIG. 5, subpixels are formed on a display area AA of a first substrate 150a, based on the circuit explained with respect to FIG. 3 or FIG. 4. The subpixels formed on the display area AA are sealed with a protective film (or protective substrate) 150b. Unexplained reference numeral NA refers to a non-display area.

The subpixels are horizontally or vertically placed in the order of red (R), white (W), blue (B), and green (G). A red (R) subpixel, a white (W) subpixel, a blue (B) subpixel, and a green (G) subpixel constitute a pixel P. The order of placement of the subpixels may vary depending on the light-emitting material, light-emission area, the configuration (or structure) of the compensation circuit, etc. Also, a red (R) subpixel, a blue (B) subpixel, and a green (G) subpixel may constitute a pixel P.

Figure 6:
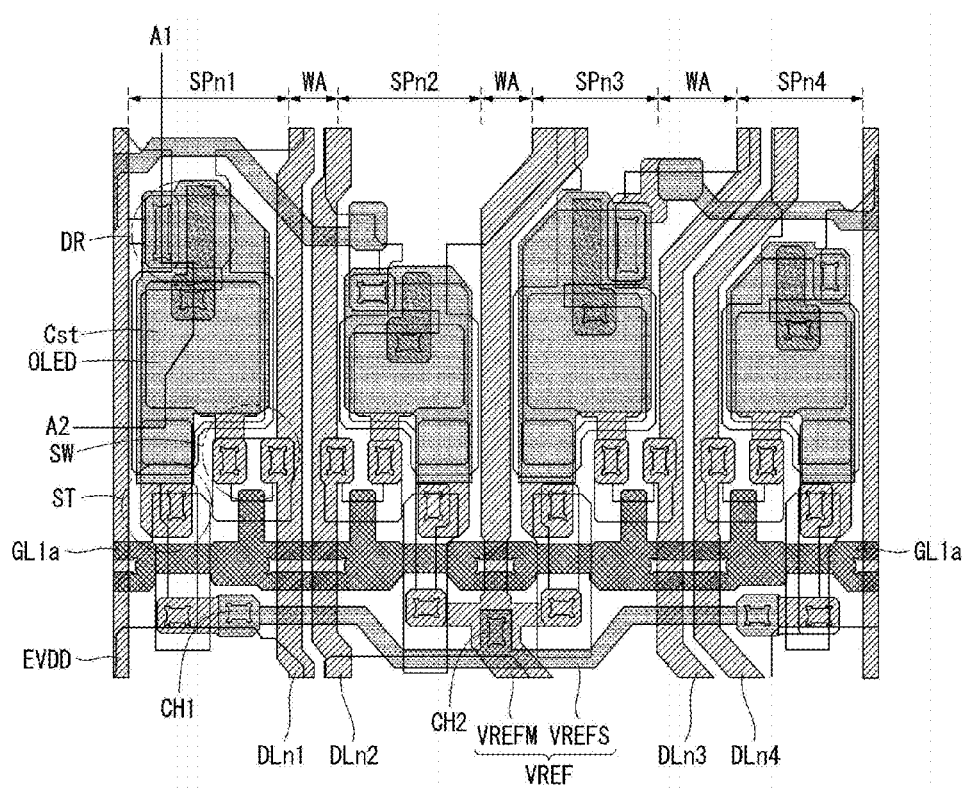
FIG. 6 is a top plan view showing some subpixels according to an exemplary embodiment of the present disclosure.
Figure 7:
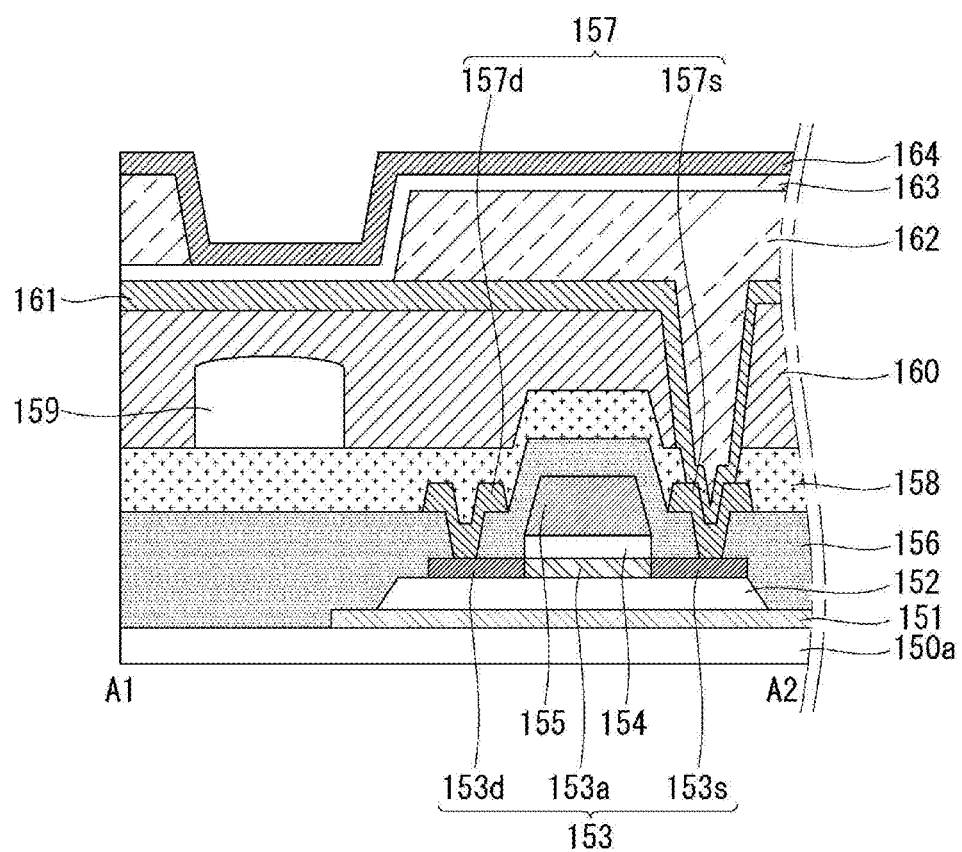
FIG. 7 is a cross-sectional view of the area A1-A2 of FIG. 6.

FIG. 6 is a top plan view showing some subpixels according to an exemplary embodiment of the present disclosure. FIG. 7 is a cross-sectional view of the area A1-A2 of FIG. 6.

As shown in FIGS. 6 and 7, horizontally placed first to fourth subpixels SPn1 to SPn4 constitute a pixel. For example, the first subpixel SPn1 may be a red subpixel (R), the second subpixel SPn2 may be a white subpixel (W), the third subpixel SPn3 may be a blue subpixel (B), and the fourth subpixel SPn4 may be a green subpixel (G).

A first power supply line EVDD is vertically placed on the left side of the first subpixel SPn1. The first power supply line EVDD is connected commonly to the first subpixel SPn1 and the second subpixel SPn2. A first data line DLn1 and a second data line DLn2 are vertically placed in the space WA between the first subpixel SPn1 and the second subpixel SPn2. The first data line DLn1 is connected to the first subpixel SPn1, and the second data line DLn2 is connected to the second subpixel SPn2. "WA" is defined as a wiring area.

A sensing line VREF is vertically placed on the left side of the third subpixel SPn3. The sensing line VREF is connected commonly to the first to fourth subpixels SPn1 to SPn4. A third data line DLn3 and a fourth data line DLn4 are vertically placed in the space WA between the third subpixel SPn3 and the fourth subpixel SPn4. The third data line DLn3 is connected to the third subpixel SPn3, and the fourth data line DLn4 is connected to the fourth subpixel SPn4.

A scan line GL1a is horizontally placed in the areas of the sensing transistors ST included in the first to fourth subpixels SPn1 to SPn4. The scan line GL1 is connected to the gate electrodes of the sensing transistor ST and switching transistor SW. The sensing line VREF comprises a vertical sensing line VREFM vertically placed and a horizontal sensing line VREFS horizontally placed. The sensing transistors ST of the first to fourth subpixels SPn1 to SPn4 are connected to the vertical sensing line VREFM through the horizontal sensing line VREFS.

A cross-sectional structure of the display panel will be described below by taking part of the first subpixel SPn1 as an example.

A light shielding layer 151 is formed on the first substrate 150a. The light shielding layer 151 may correspond to the channel region of the driving transistor DR, or divided into sections corresponding to the channel regions of the driving transistor DR, sensing transistor ST, and switching transistor SW, respectively.

A buffer layer 152 and a semiconductor layer 153 are formed on the light shielding layer 151. The light shielding layer 151, the buffer layer 152, and the semiconductor layer 153 may be sequentially laminated on the first substrate 150a, and then all of them may be patterned (batch-patterned) in the shape of an island by using the same mask. The semiconductor layer 153 illustrated in the figure is a semiconductor layer for the driving transistor DR, which is composed of an oxide semiconductor (e.g., IGZO). The parts of the semiconductor layer 153 corresponding to source and drain regions, except the part corresponding to a channel region, are made conductive and become metal electrodes or wires (metallization). The conduction process may be performed by, but not limited to, plasma etching.

A first insulating layer 154 is formed on the semiconductor layer 153, and a gate metal layer 155 is formed on the first insulating layer 154. The first insulating layer 154 may be defined as a gate insulating layer, and may be patterned in the shape of an island, like the overlying gate electrode (or gate metal layer). The first insulating layer 154 may be one selected from the group consisting of silicon-based materials: $SiO_2$, SiNx, and SiON.

The gate metal layer 155 is used as the gate electrode of the driving transistor DR of the first subpixel SPn1. Also, the gate metal layer 155 is used as an electrode, etc. that electrically connects the first to fourth subpixels SPn1 to SPn4 and the first power supply line EVDD.

A second insulating layer 156 is formed on the gate metal layer 155. The second insulating layer 156 may be defined as an interlayer insulating layer that electrically insulates between the underlying structure and the overlying structure. The second insulating layer 156 may have a plurality of contact holes exposing part of the underlying structure. The contact holes are formed by using a hole mask.

A source-drain metal layer 157 is formed on the second insulating layer 156. The source-drain metal layer 157 is split into lines constituting the first power supply line EVDD, data lines DLn1 to DLn4, and sensing line VREF, and electrodes constituting the transistors and capacitors included in the subpixels.

Referring to the part of the driving transistor DR corresponding to a part of the source-drain metal layer 157, the part of the source-drain metal layer 157 is connected to the semiconductor layer 153s and 153d of the source and drain regions, which become the source electrode 157s and drain electrode 157d of the driving transistor DR. The semiconductor layer 153a of the channel region is protected by the light shielding layer 151.

A third insulating layer 158 is formed on the source-drain metal layer 157. The third insulating layer 158 may be defined as a protective layer for protecting the structural components such as the transistors, etc. formed on the first substrate 150a.

A color filter 159 is formed on the third insulating layer 158, corresponding to an opening area. If an organic light-emitting diode to be formed later emits white light, the color filter 159 is formed on the third insulating layer 158. On the contrary, if the organic light-emitting diode emits light of red, green, or blue, the color filter 159 is not formed on the third insulating layer 158.

A fourth insulating layer 160 is formed on the third insulating layer 158. The fourth insulating layer 160 may be defined as a coating layer for making flat the surface. The third insulating layer 158 and the fourth insulating layer 160 have a contact hole exposing part of the source electrode 157s (or drain electrode; there are two types of transistors: p-type and n-type, and the source and drain electrodes are reversed depending on the transistor type)

A pixel electrode 161 is formed on the fourth insulating layer 160. The pixel electrode 161 may be defined as the anode of the organic light-emitting diode. The pixel electrode 161 is electrically connected to the source electrode 157s exposed through the fourth insulating layer 160. The pixel electrode 161 may be a transparent electrode so as to give off the light emitted from an organic emissive layer towards the first substrate 150a.

A bank layer 162 is formed on the pixel electrode 161 and the fourth insulating layer 160. The bank layer 162 has an opening area exposing part of the pixel electrode 161, and defines an actual emissive area.

An organic emissive layer 163 is formed on the bank layer 162. The organic emissive layer 163 is a layer that emits light, which may emit light of white, red, green, or blue. The organic emissive layer 163 may further comprise a functional layer, such as a hole injection layer, hole transport layer, electron transport layer, or electron injection layer, or a compensation layer such as a hole blocking layer or interface buffer layer, in addition to the emissive layer.

An upper electrode 164 is formed on the organic emissive layer 163. The upper electrode 164 may be defined as the cathode of the organic light-emitting diode. The upper electrode 164 is electrically connected to a second power supply line (not shown). The upper electrode 164 may be an opaque electrode so as to give off the light emitted from the organic emissive layer only towards the first substrate 150a. Alternatively, the upper electrode 164 may be a transparent electrode so as to give off the light emitted from the organic emissive layer in a direction opposite to the first substrate 150, depending on the purpose, function, etc. of the display panel.

A capacitor Cst is formed in each of the first to fourth subpixels SPn1 to SPn4. The capacitor Cst may have a monolayer or multilayer structure by using part of the light shielding layer, part of the gate metal layer, part of the semiconductor layer, part of the source-drain metal layer, part of the pixel electrode, and the insulating layers situated between these layers.

For display panels with UHD or higher resolution, the subpixel size is smaller compared to the previous one. Thus, the design limit requirements for a layout that requires circuit configuration within a limited space are getting tighter. In this case, the insulating layers along stepped portions caused by the lamination of multiple layers become thinner, and this may lead to structural problems (structural weak spots), including an increased risk of short-circuits between electrode layers.

Now, a test example with the above-mentioned problems will be considered, and structures for overcoming these problems according to exemplary embodiments will be described.

Figure 8:
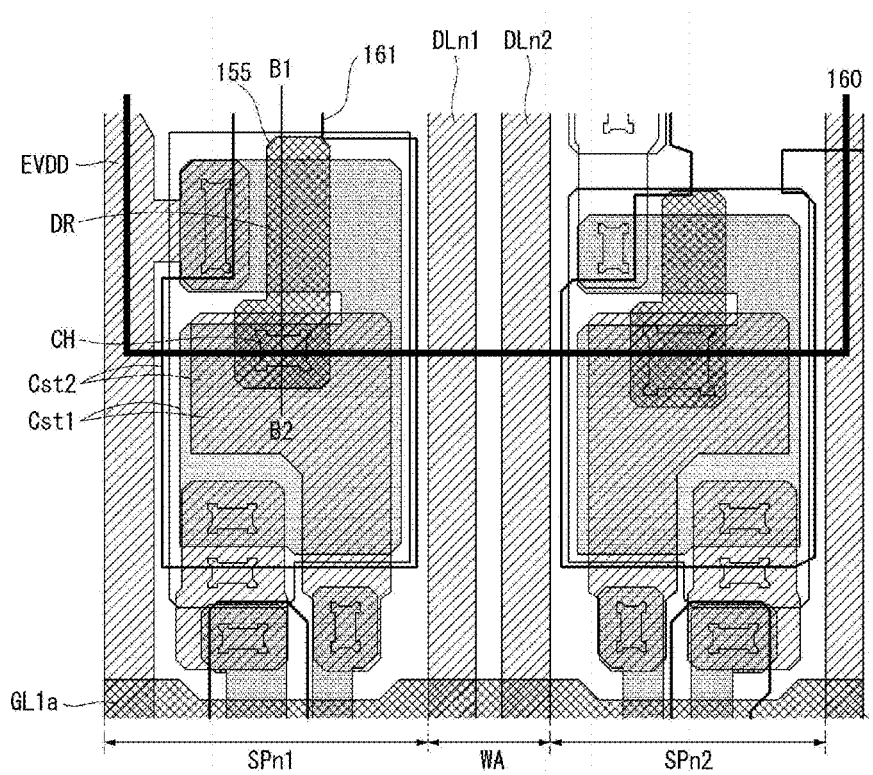
FIG. 8 is a top plan view showing some subpixels according to a test example of the present disclosure.
Figure 9:
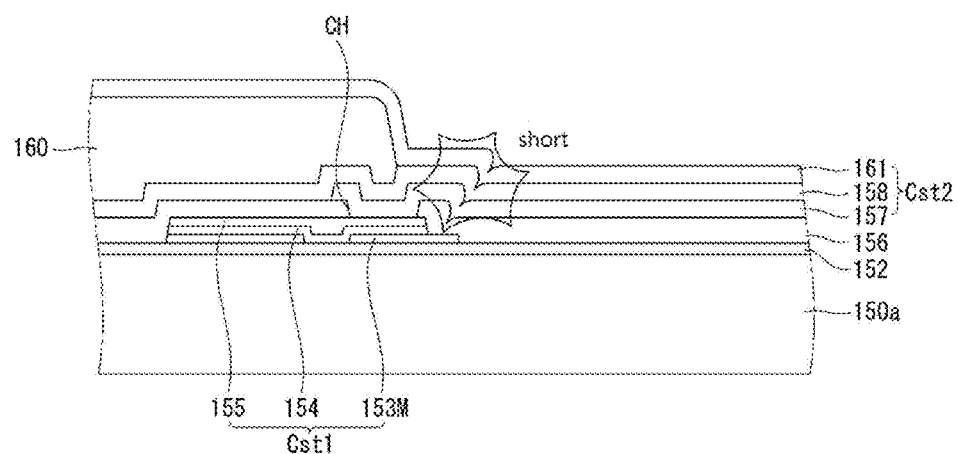
FIG. 9 is a cross-sectional view of the area B1-B2 of FIG. 8.
Figure 10:
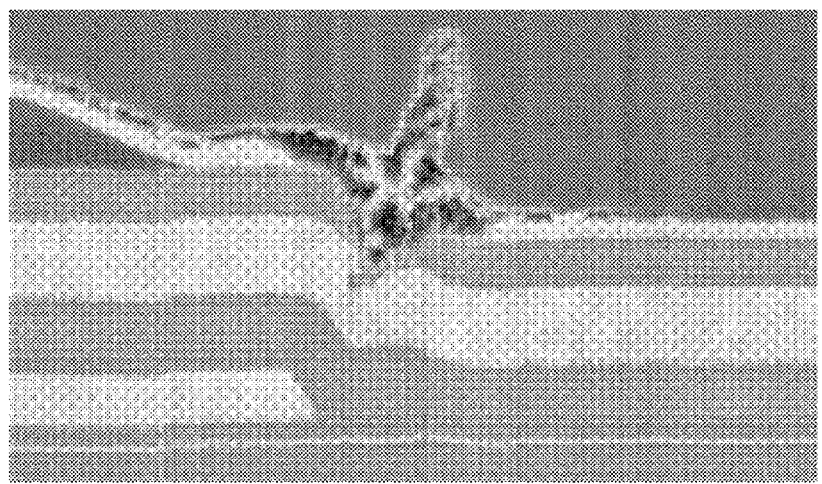
FIG. 10 is an SEM image of the subpixels of the test example.

FIG. 8 is a top plan view showing some subpixels according to Test Example of the present disclosure. FIG. 9 is a cross-sectional view of the area B1-B2 of FIG. 8. FIG. 10 is an SEM image of the subpixels of the test example.

Test Example

As shown in FIGS. 8 to 10, in the test example, part of the semiconductor layer 153M of the driving transistor DR is configured as a lower electrode of the capacitor Cst, and part of the source-drain metal layer 157 of the driving transistor DR is configured as an upper electrode of the capacitor Cst.

Then, the gate electrode of the driving transistor DR and the upper electrode of the capacitor Cst are electrically connected by using a part of the gate metal layer 155 constituting the gate electrode of the driving transistor DR. That is, the part of the gate metal layer 155 serves as the gate electrode of the driving transistor DR and also as a connecting electrode that electrically connects the gate electrode of the driving transistor DR and the upper electrode of the capacitor Cst.

The source and drain regions—part of the semiconductor layer 153M of the driving transistor DR—become conductive and therefore correspond to the parts of the semiconductor layer that are turned into conductors, so they will be hereinafter called conductive regions 153M of the semiconductor layer.

Next, a fourth insulating layer 160 is formed on the source-drain metal layer 157. The fourth insulating layer 160 is an organic film which serves as a planarization film for making flat irregularities beneath it. A pixel electrode 161 is formed on the fourth insulating layer 160 and the third insulating layer 158.

The structure corresponding to the gate metal layer 155 will be described below with reference to a part of the cross-section according to the test example.

The conductive regions 153M of the semiconductor layer are formed on the buffer layer 152 covering the first substrate 150a. A first insulating layer 154 is formed in the shape of an island on the conductive regions 153M of the semiconductor layer. A gate metal layer 155 is formed on the first insulating layer 154. A second insulating layer 156 with a contact hole exposing part of the gate metal layer 155 is formed on the gate metal layer 155. A source-drain metal layer 157 to be electrically connected to the gate metal layer 155 via the contact hole is formed on the second insulating layer 156.

Next, a third insulating layer 158 is formed on the source-drain metal layer 157. A fourth insulating film 160 is formed on the third insulating layer 158. The fourth insulating layer 160 is an organic film which serves as a planarization film for making flat irregularities beneath it. A pixel electrode 161 is formed on the fourth insulating layer 160 and the third insulating layer 158.

In the test example, the fourth insulating layer 160 is shaped in such a way that it covers only part of the gate metal layer 155 but not the other parts of the gate metal layer 155. That is, the fourth insulating layer 160 covers only part of the contact hole CH in the second insulating layer 156 formed on the gate metal layer 155.

The fourth insulating layer 160 serves to make flat irregularities beneath it so that the pixel electrode 161 where the organic emissive layer is formed is made flat. The fourth insulating layer 160 is positioned under the pixel electrode 161, and corresponds to a part of the pixel electrode 161 where the organic emissive layer is formed. In the drawing, the area from the gate metal layer 155 to the 1a-th scan line GL1a is a non-emissive area where the pixel electrode 161 does not need to be planarized. Thus, the fourth insulating layer 160 of the test example is shaped in such a manner as to cover only part of the gate metal layer 155, starting from the upper part in the drawing. That is, the fourth insulating layer 160 cover only part of the gate metal layer 155, and the stepped portion of the pixel electrode 161 caused by the fourth insulating layer 160 overlaps the contact hole CH.

The second insulating layer 156 is made thin, in order to improve the driving capability of top-gate driving transistors and meet the process requirements for high-resolutions, including forming a first capacitor Cst1 between the conductive regions 153M of the semiconductor and the source-drain metal layer 157. Also, the third insulating layer 158 is made thin, in order to form a second capacitor Cst2 between the source-drain metal layer 157 and the pixel electrode 161.

With the above-described conditions, the driving capability of the top-gate driving transistors or the formation of the first and second capacitors Cst1 and Cst2 can be improved. However, the second insulating layer 156, source-drain metal layer 157, and third insulating layer 158 are made thin along the stepped portion of the gate metal layer 155.

As a consequence, a seam is formed on the second insulating layer 156 along the stepped portion of the gate metal layer 155, a seam is formed on the source-drain metal layer 157 formed on the second insulating layer 156, a seam is formed on the third insulating layer 158 formed on the source-drain metal layer 157, and a seam is formed on the pixel electrode 161 formed on the third insulating layer 158. Due to the seams formed on the second insulating layer 156, source-drain metal layer 157, and third insulating layer 158, a short-circuit occurs between the pixel electrode 161 and the source-drain metal layer 157. As a result, the second capacitor Cst2 is not formed and disappears.

That is, the above-described conditions can affect the driving capability of top-gate driving transistors and lead to structural problems (structural weak spots) with the electrode portion forming the first and second capacitors Cst1 and Cst2. This may decrease the reliability or production yield of the display panel.

First Exemplary Embodiment

Figure 11:
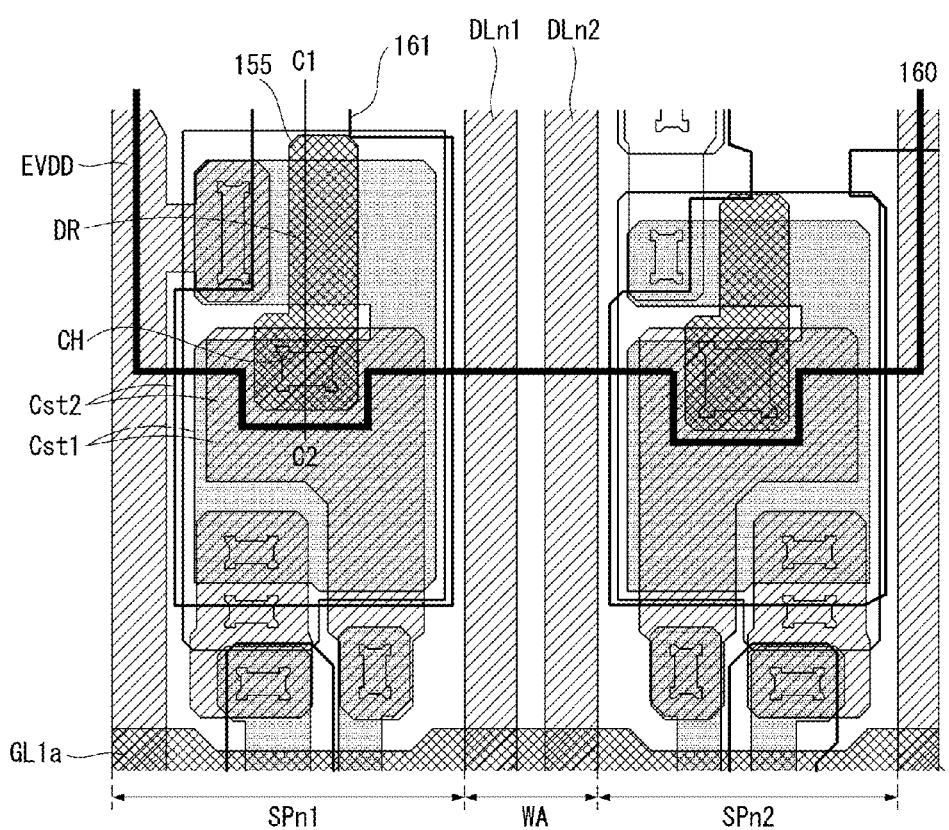
FIGS. 11 and 12 are a top plan view showing some subpixels according to a first exemplary embodiment of the present disclosure.
Figure 12:
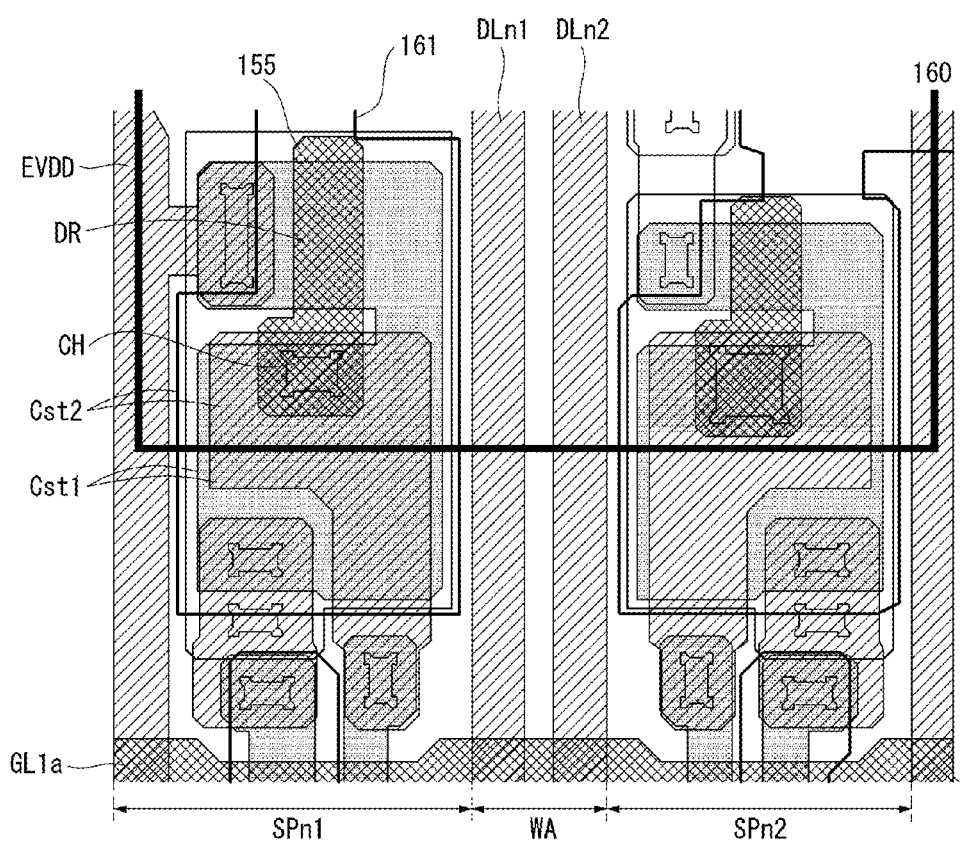
Figure 13:
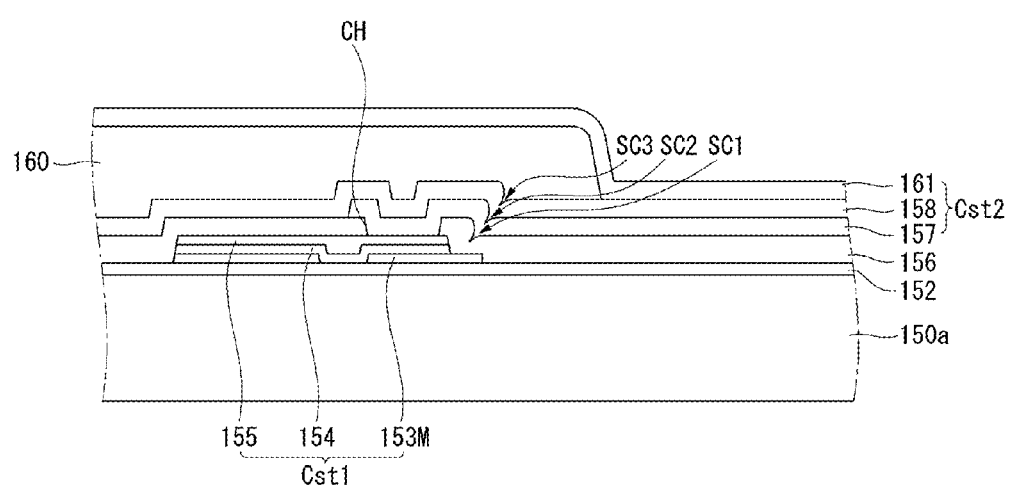
FIG. 13 is a cross-sectional view of the area C1-C2 of FIG. 11.

FIGS. 11 and 12 are a top plan view showing some subpixels according to a first exemplary embodiment of the present disclosure. FIG. 13 is a cross-sectional view of the area C1-C2 of FIG. 11.

As shown in FIGS. 11, 12, and 13, in the first exemplary embodiment, part of the semiconductor layer 153M of the driving transistor DR is configured as a lower electrode of the first capacitor Cst1, and part of the source-drain metal layer 157 of the driving transistor DR is configured as an upper electrode of the first capacitor Cst1. Also, part of the source-drain metal layer 157 is configured as a lower electrode of the second capacitor Cst2, and part of the pixel electrode 161 is configured as an upper electrode of the second capacitor Cst2.

Then, the gate electrode of the driving transistor DR and the upper electrode of the first capacitor Cst1 are electrically connected by using a part of the gate metal layer 155 constituting the gate electrode of the driving transistor DR. That is, the part of the gate metal layer 155 serves as the gate electrode of the driving transistor DR and also as a connecting electrode that electrically connects the gate electrode of the driving transistor DR and the upper electrode of the first capacitor Cst1. The source and drain regions—part of the semiconductor layer 153M of the driving transistor DR—become conductive and therefore correspond to the parts of the semiconductor layer that are turned into conductors, so they will be hereinafter called conductive regions 153M of the semiconductor layer.

Next, a fourth insulating layer 160 is formed on the source-drain metal layer 157. The fourth insulating layer 160 is an organic film which serves as a planarization film for making flat irregularities beneath it. A pixel electrode 161 is formed on the fourth insulating layer 160 and the third insulating layer 158.

The structure corresponding to the gate metal layer 155 will be described below with reference to a part of the cross-section according to the test example.

The conductive regions 153M of the semiconductor layer are formed on the buffer layer 152 covering the first substrate 150a. A first insulating layer 154 is formed in the shape of an island on the conductive regions 153M of the semiconductor layer. A gate metal layer 155 is formed on the first insulating layer 154. A second insulating layer 156 with a contact hole exposing part of the gate metal layer 155 is formed on the gate metal layer 155. A source-drain metal layer 157 to be electrically connected to the gate metal layer 155 via the contact hole is formed on the second insulating layer 156.

Next, a third insulating layer 158 is formed on the source-drain metal layer 157. A fourth insulating film 160 is formed on the third insulating layer 158. The fourth insulating layer 160 is an organic film which serves as a planarization film for making flat irregularities beneath it. A pixel electrode 161 is formed on the fourth insulating layer 160 and the third insulating layer 158.

In the test example, the fourth insulating layer 160 is shaped in such a way that it covers only part of the gate metal layer 155 but not the other parts of the gate metal layer 155.

The fourth insulating layer 160 serves to make flat irregularities beneath it so that the pixel electrode 161 where the organic emissive layer is formed is made flat. The fourth insulating layer 160 is positioned under the pixel electrode 161, and corresponds to a part of the pixel electrode 161 where the organic emissive layer is formed. In the figure, the area from the gate metal layer 155 to the 1a-th scan line GL1a is a non-emissive area where the pixel electrode 161 does not need to be planarized. Thus, the fourth insulating layer 160 of the test example is shaped in such a manner as to cover only part of the gate metal layer 155, starting from the upper part in the drawing.

The second insulating layer 156 is made thin, in order to improve the driving capability of top-gate driving transistors and meet the process requirements for high-resolutions, including forming a first capacitor Cst1 between the conductive regions 153M of the semiconductor and the source-drain metal layer 157. Also, the third insulating layer 158 is made thin, in order to form a second capacitor Cst2 between the source-drain metal layer 157 and the pixel electrode 161.

With the above-described conditions, the driving capability of the top-gate driving transistors or the formation of the first and second capacitors Cst1 and Cst2 can be improved. However, the second insulating layer 156, source-drain metal layer 157, and third insulating layer 158 are made thin along the stepped portion of the gate metal layer 155.

As a consequence, a seam is formed on the second insulating layer 156 on the stepped portion of the gate metal layer 155, a seam is formed on the source-drain metal layer 157 formed on the second insulating layer 156, a seam is formed on the third insulating layer 158 formed on the source-drain metal layer 157, and a seam is formed on the pixel electrode 161 formed on the third insulating layer 158. Due to the seams formed on the second insulating layer 156, source-drain metal layer 157, and third insulating layer 158, a short-circuit occurs between the pixel electrode 161 and the source-drain metal layer 157. As a result, the second capacitor Cst2 is not formed and disappears.

However, in the first exemplary embodiment of the present disclosure, the first insulating layer 160 serving as a planarization film is formed in such a manner as to fully overlap the gate metal layer 155, in order to overcome the problems occurring in the test example. More specifically, the fourth insulating layer 160 fully covers the gate metal layer 155, and the stepped portion of the pixel electrode 161, caused by the fourth insulating layer 160, is spaced apart from the contact hole CH.

Since the second insulating layer 156 covers the gate metal layer 155, it has a first stepped portion SC1 on the edge of the gate metal layer 155. The source-drain metal layer 157 formed on the second insulating layer 156 has a second stepped portion SC2 along the first stepped portion SC1 of the second insulating layer 156. The third insulating layer 158 formed on the source-drain metal layer 157 has a third stepped portion SC3 along the second stepped portion SC2 of the source-drain metal layer 157.

The fourth insulating layer 160 of this invention is formed in such a manner as to fully cover the first stepped portion SC1 of the third insulating layer 158, the second stepped portion SC2 of the source-drain metal layer 157, and the third stepped portion SC3 of the third insulating layer 158, in order to fill in the first stepped portion SC1 of the third insulating layer 158, the second stepped portion SC2 of the source-drain metal layer 157, and the third stepped portion SC3 of the third insulating layer 158. The first stepped portion SC1 of the third insulating layer 158, the second stepped portion SC2 of the source-drain metal layer 157, and the third stepped portion SC3 of the third insulating layer 158 are formed near the contact hole CH of the gate metal layer 155. As such, as shown in FIGS. 11 and 12, the fourth insulating layer 160 of this invention is shaped in such a manner as to completely enclose the surrounding area of the contact hole CH, allowing the stepped portion of the pixel electrode 161 to be spaced apart from the contact hole CH. The fourth insulating layer 160 has a shape in which a part protrudes from an area adjacent to the contact hole CH.

Thus, the fourth insulating layer 160 of this invention fully covers and therefore planarizes the first stepped portion SC1 of the third insulating layer 158, the second stepped portion SC2 of the source-drain metal layer 157, and the third stepped portion SC3 of the third insulating layer 158, thereby preventing a short-circuit between the pixel electrode 161 formed on the fourth insulating layer 160 and the source-drain metal layer 157.

Consequently, in the first exemplary embodiment, even if seams are formed on the first stepped portion SC1 of the third insulating layer 158, the second stepped portion SC2 of the source-drain metal layer 157, and the third stepped portion SC3 of the third insulating layer 158, no short-circuit occurs between the pixel electrode 161 and the source-drain metal layer 157 because the fourth insulating layer 160 is planarized. This will result in solving the problem that the second capacitor Cst2 disappears. That is, with the above-described conditions, the driving capability of top-gate driving transistors can be improved, and the structural problems (structural weak spots) with the electrode portions can be solved. This eliminates the problem of the decrease in the reliability or production yield of the display panel.

As can be seen from the comparison between the test example and the first exemplary embodiment, the problems in the test example occur frequently when the second insulating layer 156 and the third insulating layer 158 are made thin to improve the driving capability of the top-gate driving transistors. Thus, in the first exemplary embodiment invention, problems that may occur between the upper and lower electrodes of the second capacitor can be solved by covering short-circuit areas with the fourth insulating layer corresponding to the planarization film. Accordingly, it will be appreciated by a person having ordinary skill in the art that the present disclosure is applicable to capacitors with other layouts.

Second Exemplary Embodiment

Figure 14:
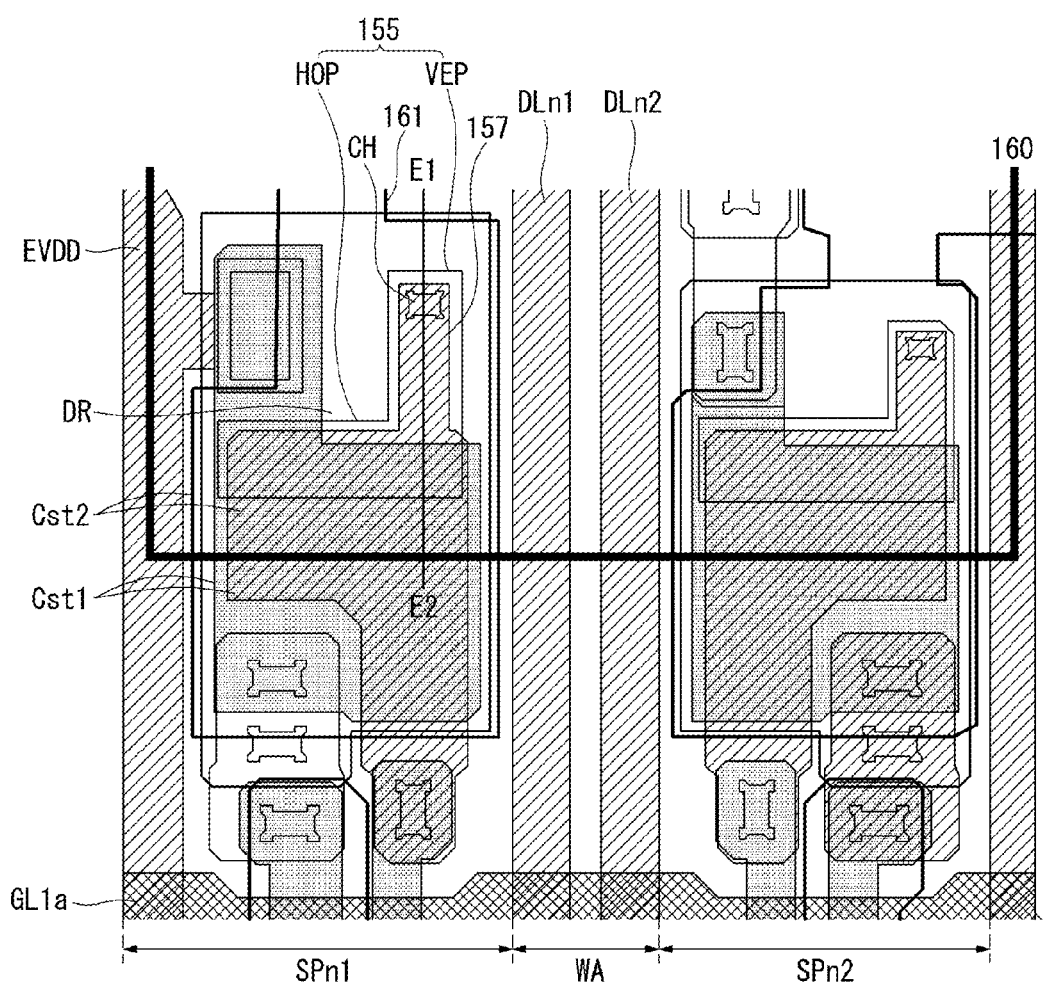
FIG. 14 is a top plan view showing some subpixels according to a second exemplary embodiment of the present disclosure.
Figure 15:
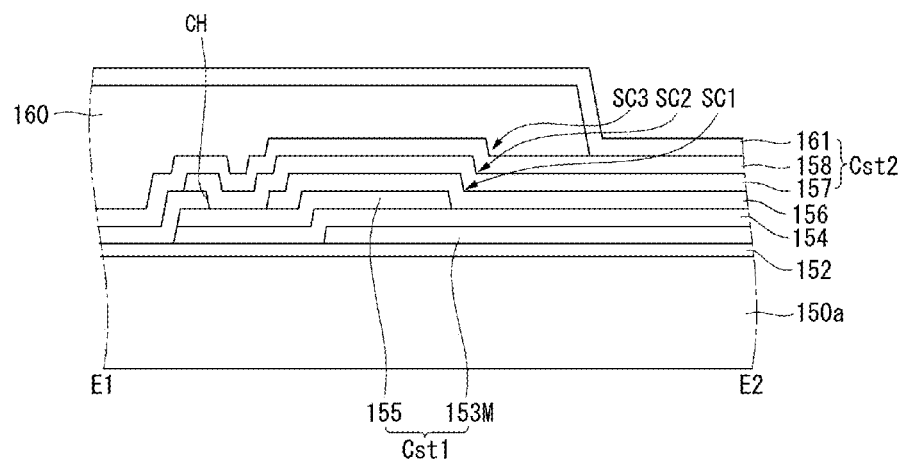
FIG. 15 is a cross-sectional view of the area E1-E2 of FIG. 14.
Figure 16:
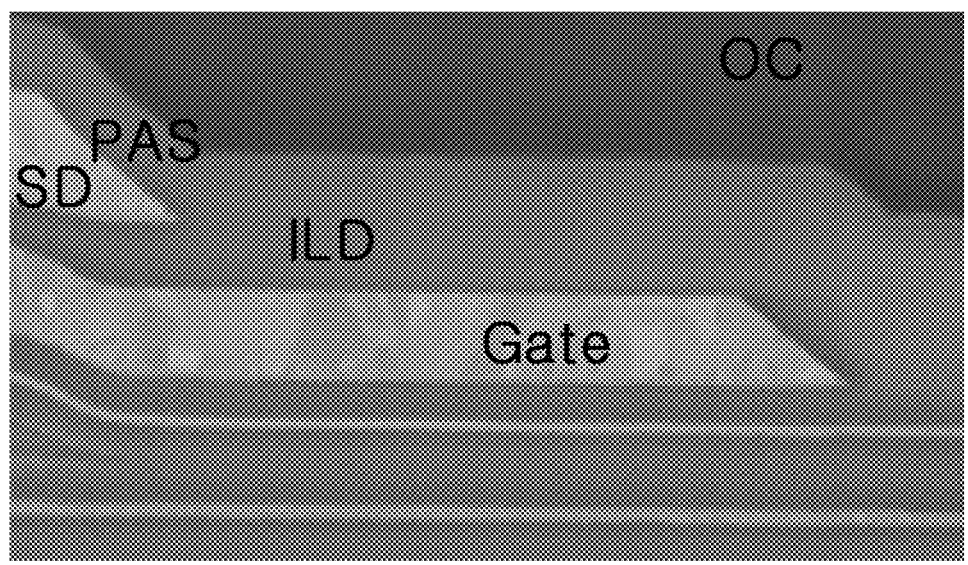
FIG. 16 is an SEM image of the subpixels of the second exemplary embodiment.

FIG. 14 is a top plan view showing some subpixels according to a second exemplary embodiment of the present disclosure. FIG. 15 is a cross-sectional view of the area E1-E2 of FIG. 14. FIG. 16 is an SEM image of the subpixels of the second exemplary embodiment. A redundant explanation of the foregoing first exemplary embodiment will be omitted below.

As shown in FIGS. 14 and 15, in the second exemplary embodiment, part of the semiconductor layer 153M of the driving transistor DR is configured as a lower electrode of the first capacitor Cst1, and part of the source-drain metal layer 157 of the driving transistor DR is configured as an upper electrode of the first capacitor Cst1. Also, part of the source-drain metal layer 157 is configured as a lower electrode of the second capacitor Cst2, and part of the pixel electrode 161 is configured as an upper electrode of the second capacitor Cst2.

In the test example and the first exemplary embodiment, the gate metal layer 155 has an T-shape. Thus, by increasing the area of the fourth insulating layer 160 and covering the surrounding area of the contact hole CH with the fourth insulating layer 160, a short-circuit between the electrodes of the second capacitor Cst2 is prevented. In the second exemplary embodiment, unlike the first exemplary embodiment, the gate metal layer 155 has a shape, other than the T-shape, with a vertical portion and a horizontal portion. Accordingly, a short-circuit between the electrodes of the second capacitor Cst2 is prevented simply by changing the shape of the gate metal layer 155, without increasing the area of the fourth insulating layer 160.

More specifically, the gate metal layer 155 comprises a vertical portion VEP and a horizontal portion HOP intersecting the vertical portion VEP. The vertical portion VEP is an area where the contact hole CH connected to the source-drain metal layer 157 is formed, which is disposed parallel to the data line DLn1. The horizontal portion HOP intersects the vertical portion VEP, and is disposed parallel to the gate line GL1a. The horizontal portion HOP is parallel to the side surface of the fourth insulating layer 160 adjacent to the horizontal portion HOP. Accordingly, the present disclosure can prevent a short-circuit between the electrodes of the second capacitor Cst2 simply by forming the gate metal layer 155 with the horizontal portion VEP and changing the shape of the gate metal layer 155 so that the fourth insulating layer 160 fully overlaps the gate metal layer 155.

The fourth insulating layer 160 is formed on the source-drain metal layer 157. The fourth insulating layer 160 fully overlaps the gate metal layer 155. The fourth insulating layer 160 fully covers the gate metal layer 155, and the stepped portion of the pixel electrode 161, caused by the fourth insulating layer 160, is spaced apart from the contact hole CH.

Since the second insulating layer 156 covers the gate metal layer 155, it has a first stepped portion SC1 on the edge of the gate metal layer 155. The source-drain metal layer 157 formed on the second insulating layer 156 has a second stepped portion SC2 along the first stepped portion SC1 of the second insulating layer 156. The third insulating layer 158 formed on the source-drain metal layer 157 has a third stepped portion SC3 along the second stepped portion SC2 of the source-drain metal layer 157. The first stepped portion SC1, the second stepped portion SC2, and the third stepped portion SC3 are disposed adjacent to each other.

The fourth insulating layer 160 of this invention is formed in such a manner as to fully cover the first stepped portion SC1 of the third insulating layer 158, the second stepped portion SC2 of the source-drain metal layer 157, and the third stepped portion SC3 of the third insulating layer 158, in order to fill in the first stepped portion SC1 of the third insulating layer 158, the second stepped portion SC2 of the source-drain metal layer 157, and the third stepped portion SC3 of the third insulating layer 158. The first stepped portion SC1 of the third insulating layer 158, the second stepped portion SC2 of the source-drain metal layer 157, and the third stepped portion SC3 of the third insulating layer 158 are formed near the contact hole CH of the gate metal layer 155. As such, as shown in FIGS. 14 and 15, the fourth insulating layer 160 of this invention is shaped in such a manner as to fully cover the gate metal layer 155 and allow the stepped portion of the pixel electrode 161 and the contact hole CH to be spaced apart from each other.

Thus, as shown in FIG. 16, the fourth insulating layer 160 of this invention fully covers and therefore planarizes the first stepped portion SC1 of the third insulating layer 158, the second stepped portion SC2 of the source-drain metal layer 157, and the third stepped portion SC3 of the third insulating layer 158, thereby preventing a short-circuit between the pixel electrode 161 formed on the fourth insulating layer 160 and the source-drain metal layer 157.

Consequently, in the second exemplary embodiment, even if seams are formed on the first stepped portion SC1 of the third insulating layer 158, the second stepped portion SC2 of the source-drain metal layer 157, and the third stepped portion SC3 of the third insulating layer 158, no short-circuit occurs between the pixel electrode 161 and the source-drain metal layer 157 because the fourth insulating layer 160 is planarized. This will result in solving the problem that the second capacitor Cst2 disappears. That is, with the above-described conditions, the driving capability of top-gate driving transistors can be improved, and the structural problems (structural weak spots) with the electrode portions can be solved. This eliminates the problem of the decrease in the reliability or production yield of the display panel.

As seen from above, the present disclosure offers the advantage of solving the problem of failure to form capacitors and their disappearance due to a short-circuit between electrodes caused by stepped portions on electrode layers, which happens because the design limit requirements for a layout that requires circuit configuration within a limited space of subpixels are tighter in implementing a display panel with UHD or higher resolution. Moreover, the present disclosure offers the advantage of improving the reliability or production yield of the display panel since structural weak spots can be eliminated or avoided by fully covering stepped portions of the electrode layers within a subpixel so that the capacitors remain.

It will be apparent to those skilled in the art that various modifications and variations can be made in embodiments in accordance with the present disclosure without departing from the spirit or scope of the invention. Thus, it is intended that the present invention cover the modifications and variations of this invention provided they come within the scope of the appended claims and their equivalents.

What is claimed is:

1. An organic light-emitting display, comprising:
a first substrate;
a semiconductor layer on the first substrate;
a first insulating layer on the semiconductor layer;
a gate metal layer on the first insulating layer;
a second insulating layer on the gate metal layer;
a source-drain metal layer on the second insulating layer;
a third insulating layer the source-drain metal layer;
a fourth insulating layer on at least one portion of the third insulating layer; and
a pixel electrode on the third insulating layer and the fourth insulating layer;
wherein a conductive area of the semiconductor layer, the first insulating layer and the gate metal layer constitute a first capacitor, and
wherein the third conductive layer, at least one of the third and fourth insulation layers and the pixel electrode constitute a second capacitor.

* * * * *